(12) United States Patent
Singh et al.

(10) Patent No.: US 8,942,502 B2
(45) Date of Patent: Jan. 27, 2015

(54) PARALLELIZATION OF VARIABLE LENGTH DECODING

(71) Applicant: STMicroelectronics International N.V., Amsterdam (NL)

(72) Inventors: Surinder Pal Singh, Noida (IN); Aneesh Bhasin, Ghaziabad (IN); Kaushik Saha, Delhi (IN)

(73) Assignee: STMicroelectronics International N.V., Amsterdam (NL)

(*) Notice: Subject to any disclaimer, the term of this patent is extended or adjusted under 35 U.S.C. 154(b) by 0 days.

(21) Appl. No.: 13/963,860

(22) Filed: Aug. 9, 2013

(65) Prior Publication Data

US 2013/0330013 A1 Dec. 12, 2013

Related U.S. Application Data

(62) Division of application No. 12/702,497, filed on Feb. 9, 2010, now Pat. No. 8,520,958.

(30) Foreign Application Priority Data

Dec. 21, 2009 (IN) .............................. 2675/DEL/2009

(51) Int. Cl.
| | |
|---|---|
| *G06K 9/36* | (2006.01) |
| *G06K 9/46* | (2006.01) |
| *G06T 9/00* | (2006.01) |
| *H03M 7/40* | (2006.01) |
| *H04N 19/44* | (2014.01) |
| *H04N 19/436* | (2014.01) |
| *H04N 19/46* | (2014.01) |
| *H04N 19/91* | (2014.01) |

(52) U.S. Cl.
CPC ................. *G06T 9/005* (2013.01); *H03M 7/40* (2013.01); *H04N 19/00533* (2013.01); *H04N 19/00521* (2013.01); *H04N 19/00545* (2013.01); *H04N 19/00951* (2013.01)
USPC ........................................................ 382/234

(58) Field of Classification Search
None
See application file for complete search history.

(56) References Cited

U.S. PATENT DOCUMENTS

| | | | |
|---|---|---|---|
| 5,440,404 A | 8/1995 | Okamoto | |
| 5,764,801 A | 6/1998 | Munemasa et al. | |
| 6,081,570 A * | 6/2000 | Ghuman et al. | 375/368 |
| 6,687,768 B2 * | 2/2004 | Horikomi et al. | 710/30 |
| 6,757,851 B1 | 6/2004 | Park et al. | |
| 7,418,146 B2 | 8/2008 | Watanabe et al. | |
| 7,680,269 B2 * | 3/2010 | Nicolai et al. | 380/28 |
| 7,847,711 B2 * | 12/2010 | Niemi et al. | 341/67 |

OTHER PUBLICATIONS

Ferguson, Thomas, et al., "Self-Synchronizing Huffman Codes", IEEE Transactions on Information Theory, vol. IT-30, No. 4, Jul. 1984, pp. 687-693.
Lam, Wai-Man, et al., "Extended Synchronizing Codewords for Binary Prefix Codes", IEEE Transactions on Information Theory, vol. 42, No. 3, May 1996, pp. 984-987.
Klein, S. T., et al., "Parallel Huffman Decoding with Applications to JPEG Files", The Computer Journal, 46(5), British Computer Society 2003, pp. 487-497.

* cited by examiner

*Primary Examiner* — Vikkram Bali
(74) *Attorney, Agent, or Firm* — Allen, Dyer, Doppelt, Milbrath & Gilchrist, P.A.

(57) ABSTRACT

Parallelization of decoding of a data stream encoded with a variable length code includes determining one or more markers, each of which indicates a position within the encoded data stream. The determined markers are included into the encoded data stream together with the encoded data. At the decoder side, the markers are parsed from the encoded data stream and based on the extracted markers. The encoded data is separated into partitions, which are decoded separately and in parallel.

15 Claims, 6 Drawing Sheets

PARALLELIZATION OF VARIABLE LENGTH DECODING

RELATED APPLICATION

This application is a divisional of and claims the benefit of U.S. patent application Ser. No. 12/702,497 filed Feb. 9, 2010 and claims the benefit of India Application No. 2675/Del/ 2009 filed Dec. 21, 2009. The disclosure of the foregoing United States Patent Application is specifically incorporated herein by this reference.

BACKGROUND OF THE INVENTION

1. Field of the Invention

The present invention relates to variable-length encoding and decoding of data. In particular, the present invention relates to parallelization of such a decoding.

2. Description of the Related Art

Variable length coding is coding that assigns code-words with different lengths to different symbols of an alphabet. A counterpart of variable length coding is a fixed length coding. Fixed length coding assigns a code-word with the same length to each symbol. For instance, if communication is performed using the alphabet consisting of four symbols A1, A2, A3, and A4, these symbols may be encoded each with two bits using a code C such that C(A1)="00", C(A2)="01", C(A3)="10", and C(A4)="11". Let us now assume that input data sequence to be encoded is input-data={A1, A2, A4, A1, A3, A1, A1}.

Then the data after encoding by the fixed length code C will be

C(input-data)="00 01 11 00 10 00 00".

(In this example, the spaces between the code-words of particular symbols are for better intelligibility only and do not belong to the encoded sequence.) The length of encoded data is given by the number of coded symbols which, in the above case, is 7, multiplied by length of the symbols, which is in our case equal to two for all code-words, resulting in the length of the resulting coded stream being 14.

The variable length coding is also called entropy coding if the code-word length of code-words assigned to particular symbols of an alphabet is determined based on occurrence probabilities of those symbols. In particular, the most probable symbols are encoded with code-words having the shortest possible length. According to the Shannon's theorem, the optimal code length $W_s$ in bits for a symbol s with probability $P_s$ is given by $W_s = -\log_2 P_s$.

Thus, entropy encoders typically try to assign to each symbol of an alphabet a code-word with a length proportional to the negative logarithm of the symbol probability. In order to design such an entropy code, the probability distribution of the source has to be known or assumed. The distribution of a source generating symbols from an alphabet is given by probability of occurrence of each symbol of the alphabet (also known as an a priori probability). If the probability of occurrence of all symbols is equal, the entropy coding is equivalent to fixed coding, which means that employing a variable length code does not, in general, lead to improvement of the coding gain. Thus, entropy coding only makes sense for non-uniformly distributed sources.

The advantage of entropy coding is that for non-uniformly distributed sources it may reduce the amount of data necessary for coding an input data stream without degrading its quality. This means that entropy coding is inversible and the encoded data may be completely restored by the inverse entropy decoding in case no error has occurred in the coded bit stream during its transmission or storing. For non-equally distributed sources, entropy coding may provide a considerable coding gain. Therefore, entropy coding has been widely used in a very broad spectrum of applications, such as text compression, for instance, zip or gzip; image compression, for instance, jpeg, png, svg, tiff; or video compression, such as MPEG2, MJPEG, H.264/MPEG-4 AVC, etc.

Figure 5:
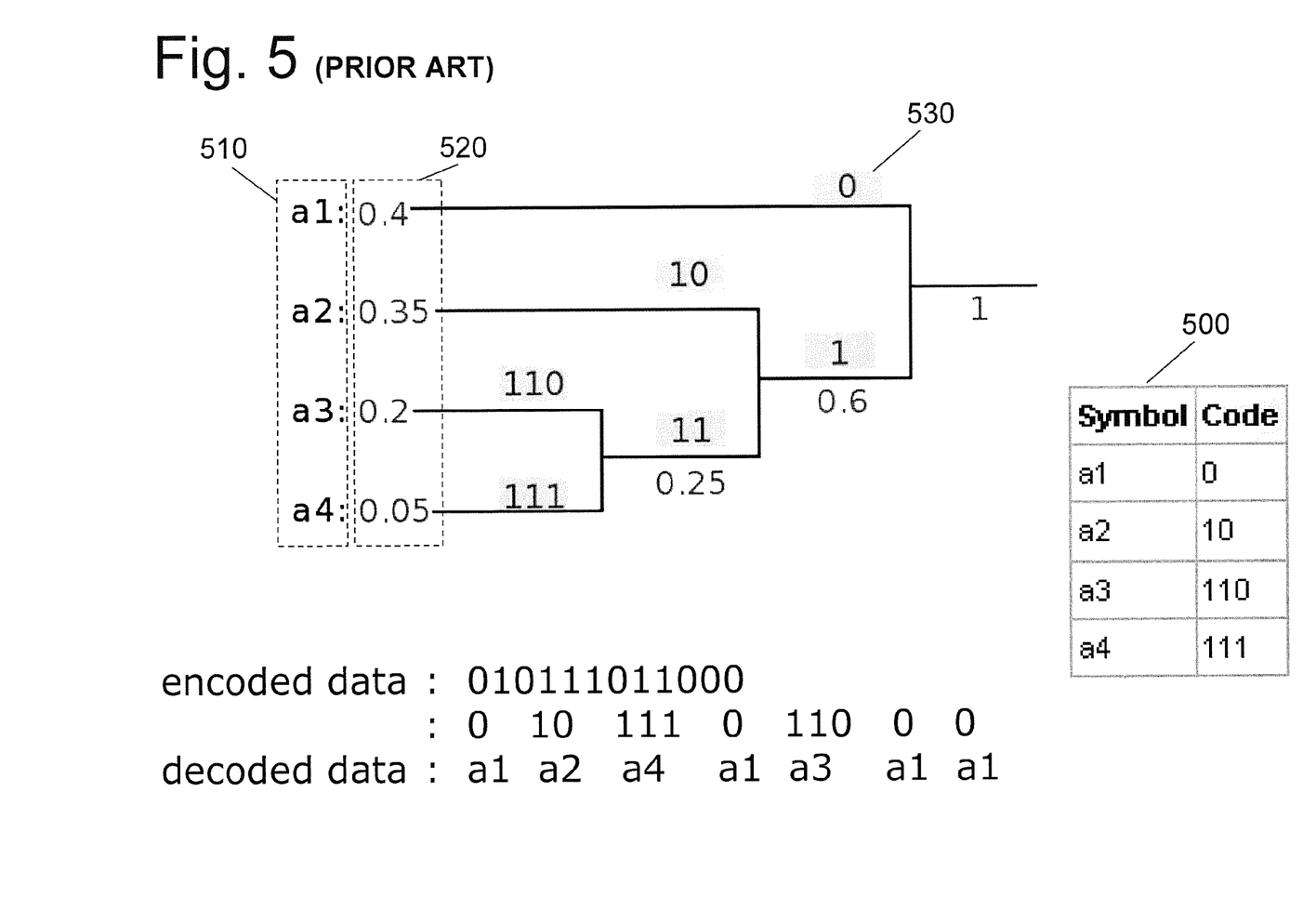
FIG. 5 is a schematic drawing illustrating an example of construction of a Huffman code and a corresponding codeword table known from prior art.

One of the very popular entropy coding methods is called Huffman coding. Huffman coding is designed for a given alphabet of symbols based on their occurrence probabilities as illustrated in FIG. 5. In this example, an alphabet of four symbols A1, A2, A3, and A4 is used for transmitting the data similarly to the above example regarding fixed length code. The a priori probability of occurrence of these symbols is P(A1)=0.4, P(A2)=0.35, P(A3)=0.2, and P(A4)=0.05. Construction of Huffman code for a given symbol alphabet is performed by constructing a binary tree as follows. Each symbol s of the alphabet 510 is assigned a probability of occurrence P(s) 520. As long as there is a plurality of nodes which are not part of the binary tree, in each step of the Huffman code construction, two nodes with minimum probability are joined into a common node, while the new common node is assigned a probability equal to a sum of probabilities of the joint nodes. This is illustrated in FIG. 5. In the first step, nodes corresponding to symbols A3 and A4 are joined and a new node with probability 0.25 is created. In the second step, the new node is joined with the node corresponding to symbol A2 and assigned the probability of 0.6. In the last step, this node is joined with the node corresponding to symbol A1, resulting in a common root node of the binary tree. The code-words of the so-constructed Huffman code are then determined by marking each edge of the binary tree by a binary value 530. For instance, the upper edge is assigned a binary value of 0 and the lower edge is assigned a binary value of 1. By reading the binary values on the edges from the root towards each symbol S, a coding table 500 is specified.

The coding table 500 is then used for encoding the input data. Let us assume a sequence of input symbols similar to the example presented above for a fixed length coding:

input-data={A1, A2, A4, A1, A3, A1, A1}.

Using the code-word table 500, representing Huffman code H, the coded bit stream is given by H(input-data)="01 01 11 011 000".

(In this example, the spaces between the code-words of particular symbols are for better intelligibility only and do not belong to the encoded sequence.) The length of this encoded data is 12 bits, which is less than 14 bits needed for encoding the same symbol sequence with a fixed length code. The construction of Huffman code using the binary tree ensures that the resulting code is a so-called prefix code which can be uniquely decoded.

In general, variable length coding has to be decoded serially in order to determine the respective code-words and boundaries between them. For instance, in the data stream H(input-data) encoded by the Huffman code, the respective code-words are identified during the decoding. The first code-word is "0". According to the coding table 500, there is only a single code-word starting with 0 which is the code-word corresponding to the symbol A1. Consequently, the first binary symbol 0 corresponds to the code-word "0" for the symbol A1. The next binary value of the encoded bitstream is 1. There are three code-words in the coding table 500 starting with binary symbol 1. Therefore, the next binary symbol 0 is the encoded bitstream also belongs to the same code-word. Since there is only one code-word in the table 500 which starts with binary sequence "01", the second and the third binary symbols of encoded data are identified as a code-word for symbol A2. In a similar way, the rest of the encoded data stream is parsed into code-words "111", "0", "110", "0", and "0" corresponding to symbols A4, A1, A3, A1, and A1 of the input data sequence. As can be seen from this example, entropy decoding is inherently serial. The start of the next code-word cannot be identified before the previous code-words have been decoded. Consequently, the entropy decoding procedure such as Huffman decoding cannot be easily parallelized.

However, parallelization of decoding is an essential means to meet a trade-off between the power and the performance in the employed computing systems. Especially in embedded systems, in order to achieve low power solutions, multi-core architectures are often deployed. The main challenge in the programming of multi-core architectures is parallelization, which means, separating of the task to be performed into sub-tasks that may be performed in parallel and possibly independently of each other. In applications using entropy coding for compressing data, such as text compression tools, audio, image or video compression algorithms, the entropy coding represents a bottleneck to an effective parallelization. Nevertheless, in particular image and video compression and decompression including entropy coding is an application where parallelization is necessary in order to allow real time and low power encoding and decoding especially for portable devices operating on batteries or accumulators.

Figure 6:
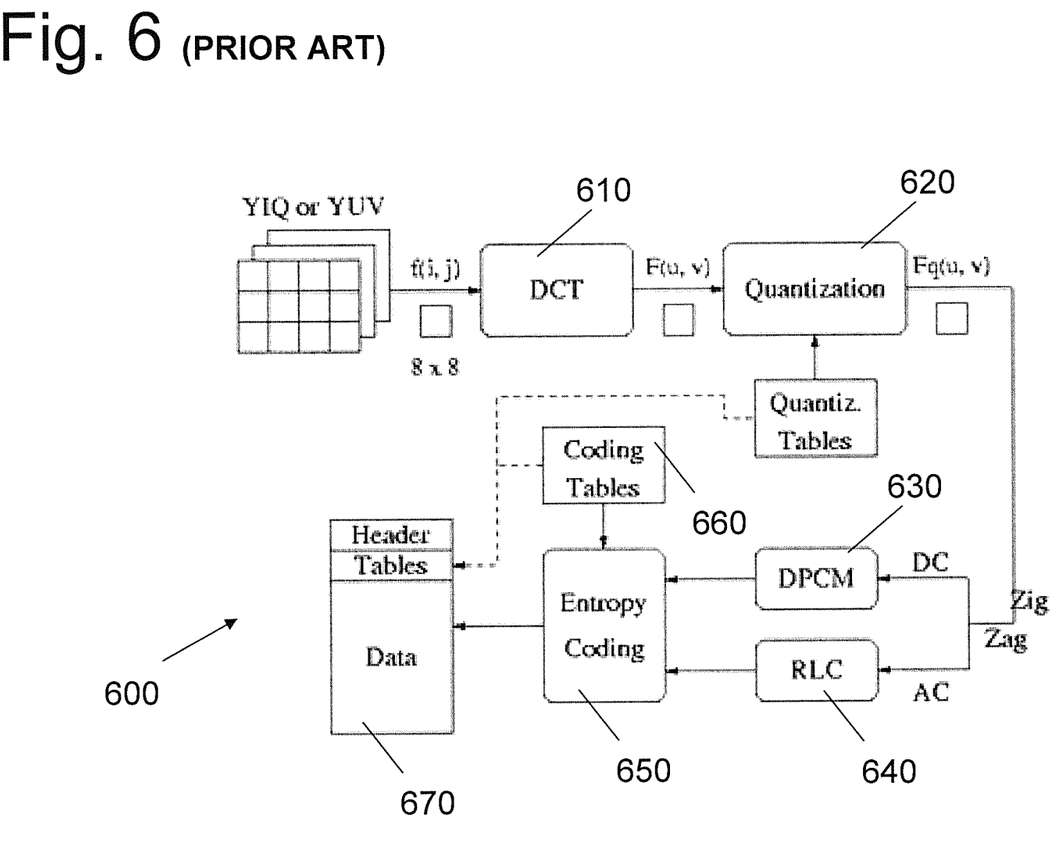
FIG. 6 is a block diagram illustrating function of an example JPEG encoder known from prior art.

FIG. 6 illustrates an example of a JPEG baseline encoder 600. An input image is first subdivided into blocks of 8×8 pixels. Each block is transformed by a discrete cosine transform (DCT) 610 and each transformed block of transformation coefficients is further quantized 620 and serialized by means of a zig-zag scan. The DC component is encoded using differential pulse coded modulation (DPCM) 630 and the AC components are further encoded by a run length coding (RLC) 640. The so encoded DC and AC components are finally encoded by an entropy encoder 650 which encodes the input symbols into code-words according to a coding table 660. JPEG standard utilizes Huffman coding. The encoded bitstream 670 may be added an information about the coding table used, in order to allow the updating of the coding table and thus an adaptation of the entropy code to a possibly varying statistics of the source, for instance, for different images.

The performance gain that can be achieved by the use of a multi-core processor is strongly dependent on the software algorithms and their implementation. In particular, the possible gains are limited by the fraction of the software that can be parallelized to run on multiple cores simultaneously.

In order to parallelize JPEG decoding, for instance, the inverse discrete cosine transform (IDTC) and color conversion may be parallelized. However, such a parallelization only gains about 14% speed-up, approximately 12% for the IDCT and 2% for the color conversion. Since the entropy decoding cannot be easily parallelized, the parallelization of the remaining image decoding steps may only be used after the data necessary for such decoding have been serially entropy decoded.

Similar situation may also occur for other applications which employ variable length coding, such as compression of any date by a mechanism using entropy coding such as zip, gzip, rar etc., or other image, video or audio compression methods utilizing entropy codes. Moreover, the above described problem of identifying the starting points and the endpoint of the code-words is not specific to the Huffman code exemplified in FIG. 5. Other variable length codes, such as Shannon-Fano coding, adaptive Huffman coding, or universal codes such as Golomb, Elias, or unary codes, also need to be decoded serially.

From the prior art, several ways for synchronizing the decoding of an entropy encoded data stream are known. For instance, T. J. Ferguson and J. H. Rabinowitz: "*Self-synchronizing Huffman codes,*" *IEEE Tans. Inform. Theory*, Vol. 30, No. 4, 1984, pp. 687-693 analyzes synchronization by synchronizing code-words, after decoding of which the decoding of a Huffman code synchronizes.

In W. M. Lam and S. R. Kulkarni: "*Extended synchronizing codewords for binary prefix codes,*" *IEEE Trans. Inform. Theory*, Vol. 42, No. 3, 1996, pp. 984-987, the synchronizing code-words form part of the entropy coded data and may be used to carry coded information like other code-words and/or as extra symbols inserted between other encoded code-words.

The problem of parallel decoding is handled in S. T. Klein and Y. Wiseman, "*Parallel Huffman decoding with applications to JPEG files,*" *The Computer Journal, British Computer Society*, Vol. 46, No. 5, 2003, pp. 487-497. Accordingly, the self-synchronization at the synchronizing codewords is utilized to partially parallelize the decoding of a Huffmann code.

The efficiency of such parallel decoding depends on the self-synchronizing properties of the applied variable length code and on the content of the coded data. Thus, it does not enable optimizing the load balancing of the parallel decoder.

SUMMARY OF THE INVENTION

Given these problems with the existing technology, it would be advantageous to provide a method and a system capable of parallel decoding of a bitstream encoded by a variable length code.

It is the particular approach of the present invention to mark boundaries between partitions of entropy coded data by adding partition markers to the encoded data stream in such a way that they can be decoded independently. It is advantageous to form the partitions so that their decoding results in an approximately equal number of computations on the parallel decoders. This enables load balancing in a parallel processing environment.

In accordance with a first aspect of the present invention, a method is provided for parallel decoding of a data stream which includes data encoded with a variable length code, and marker data. The method comprises extracting the marker data from the data stream, wherein the marker data indicate a position within the data encoded with the variable length code. The method further comprises subdividing the data encoded with the variable length code to a plurality of partitions according to the extracted marker data. The method also comprises decoding the encoded data in the plurality of partitions separately and in parallel.

In accordance with a second aspect of the present invention, a method is provided for encoding of input data into a data stream. The method includes encoding the input data using a variable length code, determining marker data indicating a position within the encoded input data and adding the encoded input data and the determined marker data into the data stream.

In accordance with a third aspect of the present invention, a computer program product comprising a computer-readable medium having a computer-readable program code embodied thereon is provided, the program code being adapted to carry out the present invention.

In accordance with a fourth aspect of the present invention, a parallel decoder for decoding of a data stream which includes data encoded with a variable length code and marker data. The parallel decoder comprises a parser for extracting the marker data from the data stream, wherein the marker data specify a position within the data encoded with the variable length code, a parallelizer for subdividing the encoded data to a plurality of partitions based on the extracted marker data, and a parallel variable-length-code decoder for decoding the data encoded with a variable length code in the plurality of partitions in parallel.

In accordance with a fifth aspect of the present invention, an encoder for encoding input data into a data stream s provided. The encoder includes a variable length coder for encoding the input data using a variable length code, a marker setting unit for determining marker data signaling a position within the encoded input data, and a bitstream generator for including into the data stream the encoded input data and the determined marker data.

BRIEF DESCRIPTION OF THE DRAWINGS

The accompanying drawings are incorporated into and form a part of a specification to illustrate several embodiments of the present invention. These drawings together with the description serve to explain the principles of the invention. The drawings are only for the purpose of illustrating preferred and alternative examples of how the invention can be made and used and are not to be construed as limiting the invention to only the illustrated and described embodiments. Further features and advantages will become apparent from the following and more particular description of the various embodiments of the invention, as illustrated in the accompanying drawings, in which like reference numbers refer to like elements and wherein.

DETAILED DESCRIPTION OF PREFERRED EMBODIMENTS

According to the present invention, in addition to the bitstream of data encoded by an entropy code, partition markers are provided as a side information. The purpose of the partition markers is to mark boundaries between code-words of the entropy code at predefined places. It is advantageous to signalize the partition markers for a plurality of partitions that can then be decoded independently by a plurality of parallel decoders. In order to balance the load of such a parallel decoding, the partitions should be designed so as to result in an approximately equal number of computations performed during decoding for each of the partitions. Such load balancing enables, for instance, an efficient use of multi-core computing system architectures.

Figure 1:
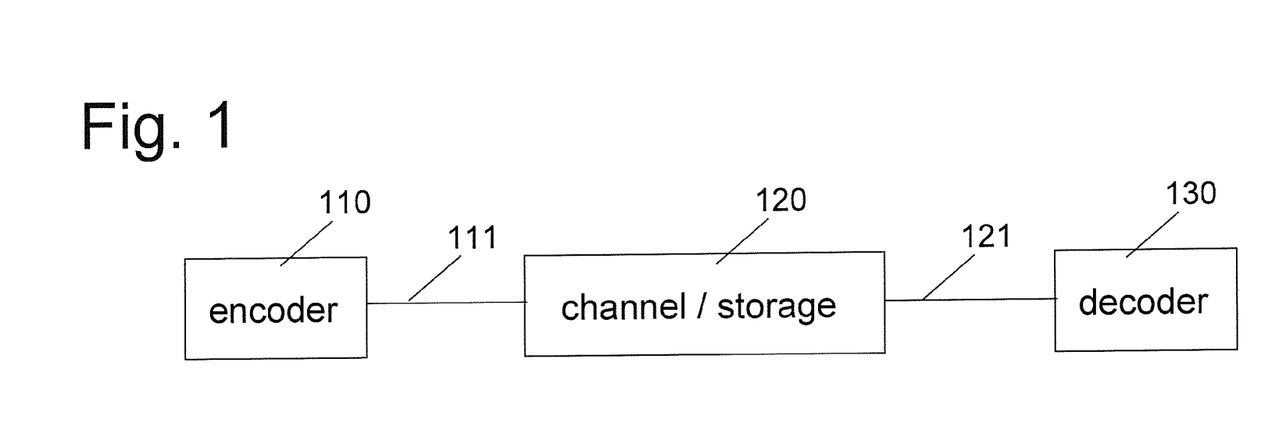
FIG. 1 is a block diagram illustrating an example of a system for employing the present invention.

An example system for employing the present invention is illustrated in FIG. 1. At an encoder side 110, input data are encoded with a variable length code, resulting in encoded data. The partition markers are added at the encoder side 110 to the encoded data resulting in encoded data stream 111. The encoded data stream is then stored in a storage 120 or transmitted over a channel 120. The transmitted or stored data stream 121 is then retrieved from the storage or received from a channel and decoded at the decoder side 130. In particular, after having extracted the partition markers from the encoded and retrieved data stream 121, the encoded data is separated into individual partitions according to the partitions markers. The individual partitions may be decoded separately and concurrently.

FIG. 1 is a schematic drawing illustrating a general structure of a system, in which the present invention may advantageously be employed. A particular example of such a system may be a personal computer with a storing means for storing a program implementing encoding 110 and/or decoding 130 of the input data according to any embodiment of the present invention. After encoding the input data and determining the partition markers, the encoded data stream may be stored in a storage 120. The storage may be an internal storage such as a hard disc or a flash memory, or any kind of memory such as random access memory, etc. However, the storage may also be an external drive based on any available or future technology such as magnetic or optic disc, flash memory, tape, etc. After the encoded data stream has been stored (for instance as a single file or a plurality of files), it may be retrieved again from the storage and decoded by a decoding program.

Alternatively, or after having been buffered or stored, the encoded data stream may be transmitted over a channel to a decoder side. For instance, the encoded data stream may be transmitted over a network to another personal computer, a server, a projecting device, a personal assistant device (PDA), a mobile phone or any other device, which comprises means for decoding 130 of the encoded data stream. These devices may, but do not necessarily have to also comprise means for encoding similarly to the personal computer as described above. The channel may be any of, or a combination of wired and wireless channel with a standardized or a proprietary transmission protocol. In particular, the encoded data stream may be transmitted over any kind of LAN, MAN, or WAN; over Internet; over any wireless technology such as WLAN, WiMax, GSM, GPRS, UMTS, their extensions, or any other systems and technologies. The decoder side 130 receives the encoded data stream and decodes it.

In general, the system of FIG. 1 may be implemented within a single device such as a personal computer, a portable terminal, a hard drive with compression facility. In such a case, the device comprises an encoding unit 110, a storage 120, and a decoding unit 130. Such a device may also be capable to form a system as shown in FIG. 1 with another device which has an access on the same storage or can be connected to said device via a channel. Alternatively, the system of FIG. 1 may include at the encoder side only an encoding unit and possibly a storage or an interface to a channel and the decoder side may only comprise a decoding unit and possibly a storage or an interface to a channel. A typical example for such a system may be a video camera with encoding means and a projecting device with decoding means only. The encoding and/or the decoding may be implemented as a software for a general-purpose processor, or in an embedded system, or in a programmable hardware, or in any hardware structure. The input data may be any data such as text, image data, video data, binary data or any other kind of data.

Figure 2:
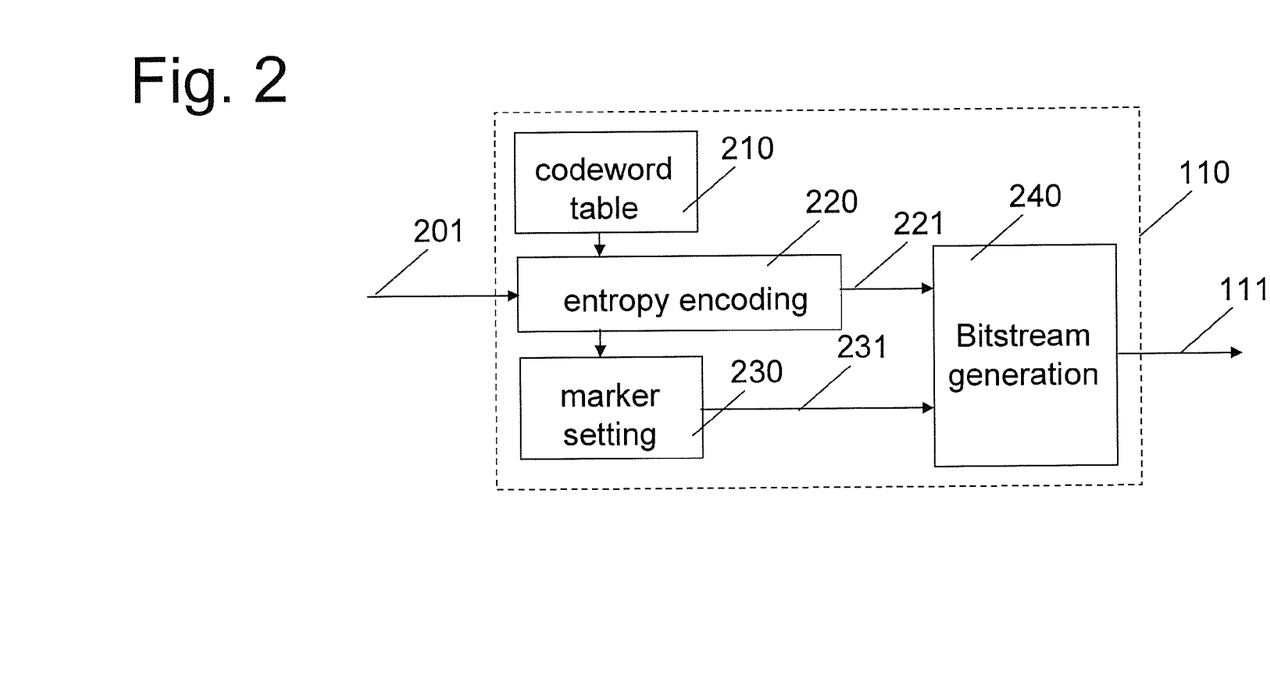
FIG. 2 is a block diagram illustrating an example of an encoder according to the present invention.

The structure of an encoder 110 in accordance with the present invention is illustrated in FIG. 2. An input symbol sequence 201 is entered into the encoder 110. An entropy encoder 220 encodes the input symbols 201, which means that the entropy encoder 220 assigns a code-word to each input symbol, in accordance with a code-word table 210. The code-word table 210 may be similar to the example code-word table 500 described in connection with FIG. 5—that is, it may contain a unique code-word for each single symbol. However, the present invention is not limited thereto, and the variable length code may also assign a unique code-word to a combination of a plurality of symbols. Alternatively, the code-word table does not need to be necessarily a table storing for each symbol a code-word. The code-word table may alternatively be represented by a rule or function for generating a variable length code-words. For instance, it may be rule for assigning to an integer a code-word of an universal code such as unary, or Elias or Golomb, or any other code.

The entropy encoder 220 provides information to a marker setting unit 230, which determines markers to be added to the encoded data 221. In particular, the information provided to the marker setting unit may concern any of the boundaries of the encoded code-words, the length of code-words encoded, the number of symbols to be included into the encoded data stream, the total length of bits of the already encoded data, etc. In other words, the information provided to the marker setting unit 230 may be an information which will enable the marker setting unit 230 to decide how the encoded data will be subdivided into partitions, which means, how long the partition shall be so that load-balancing is possible for a given parallel decoder. The determined markers 231 and the entropy coded bitstream 221 are combined 240 and output as a bitstream 111 for being transmitted or stored.

The aim of the marker setting unit 230 is to determine a position to which a partition marker shall refer and to generate such a partition marker 221. This position may be determined, for instance, in order to enable load balancing of the decoding under the assumption that parallel decoding is performed for partitions of the encoded bitstream separated by the markers. It may be advantageous to sum up the lengths of the code-words produced during the entropy coding 220 and then to provide markers in such a way that they separate the entropy encoded data 221 into partitions requiring essentially the same decoding complexity, for instance, partitions the information content of which is approximately the same. One way to do this is to sum the length of the code-words produced during the encoding process and assign equal sums to each partition.

Alternatively, the partitions may be formed so as to include an approximately equal number of symbols. As another alternative, the partitions may be formed in order to comprise a single block or a plurality of blocks or macroblocks, in case the entropy coder 220 for coding image or video data. Similarly, for text data, the partitions may be set in order to form equally long portions of text. In general, it is beneficial to choose the partitions with respect to the parallelization to be performed at the decoder 130 in order to essentially equally distribute the decoding load to the parallel decoders. Here, the decoding does not necessarily only refer to the entropy decoding, and may also concern other kinds of audio, text, image, or video data.

A bitstream generator 240 then combines the entropy coded data 221 with the partition markers 231 into a common data stream 111, which is typically a bitstream composed of binary zeros and ones. This combining is usually performed in accordance with predefined syntax rules.

It is particularly advantageous for the signaling of the partition markers to use already existing and possibly standardized data structures. For instance, various standardized file formats for storing of the compressed data provide unused or reserved fields of certain length, or a possibility to add an additional information portion by means of defining an additional field and its length. Similarly, headers of packets with encoded data typically define reserved fields, marked for instance as reserved-for-future-use (RFU), or a possibility to extend the header with an additional information. In some standards, special data units are defined for additional information, for instance an application specific information. Standard decoders which decode such files or packets may then simply ignore the additional information, while applications that are able to interpret the additional information correctly, may use it. Within such reserved spaces, the partition markers may advantageously be embedded.

For the purpose of the present invention, a partition marker may include a tuple (a couple) consisting of a byte offset within the entropy encoded bitstream and a bit offset within the byte. For instance, let us assume an entropy coded bit sequence encoded in accordance with the Huffman entropy code H described above and given by the code-word table 500:

encoded-data="0 01 111 0 110 0 0 0 10 10 111"

(In this example, the spaces between the code-words of particular symbols are for better intelligibility only and do not belong to the encoded sequence.) In order to allow parallelized decoding of this encoded bitstream, a partition marker may be signalized as a couple $\{1, 2\}$ indicating that at the position after one byte and two bits, an entropy code code-word begins. In this example, this may be interpreted as subdividing the encoded data sequence into two partitions, wherein the first partition is formed by one byte and two bits and the second partition second partition starts immediately after the first partition, that is, after the first ten bits. Consequently, the partition marker represented by the couple $\{1, 2\}$ enables parallel decoding by two decoders of the two partitions:

partition1="0101110110", partition2="0001010111".

In this example, there are only two partitions. It is assumed that parallelization of the decoding is performed for two parallel decoders. However, the present invention is not limited to parallel decoding using two decoders only. In general, more than two decoders may be employed. In order to facilitate this, the encoded data stream has to be added a plurality of partition markers.

The format of the partition markers described below is only an example. For the purpose of the present invention, partition markers different from the couples {byte offset, bit offset} may be used. For instance, a marker may be specified by means of a bit offset only. Other units than bits and bytes may also be used to specify the offset. For instance, a unit corresponding to a maximum length of a variable-length code-word, or any other unit may be considered. The marker may also be a triplet of byte offset, bit offset within a byte and the place from which the offset is measured (middle, end, or start of the coded data or the end of the previous partition, etc.).

Each couple of byte offset and bit offset from among the partition markers of the encoded data may be considered absolutely, that means from the beginning of the entropy encoded data. This may lead, especially for long data streams, to large byte offsets, which, in turn, may reduce the efficiency of partition marker encoding. Differential coding may be applied to such partition markers. Alternatively, the couples of byte offset and bit offset may also be considered relatively, which means in respect to the start of the current partition, assuming that the next partition starts immediately after the end of the current partition.

A couple of byte offset and bit offset may refer either to a position where a current partition ends or to a position where a new partition starts. For instance, a couple {1, 2} may have a meaning of length of a partition as assumed in the above example (the first partition is 10 bit long). However, it may be interpreted as a marker of the beginning of a new partition, which means that the first partition is 9 bits long and the new partition starts with the tenth bit of the encoded data. The interpretation should be fixedly defined for a particular application.

Alternatively, the relative position of the partition with respect to the middle point of the encoded data may also be used. This may be particularly advantageous for the case of a low number of partitions, especially for two partitions. The bit offset within the byte may be signaled using three bits. The length of the marker depends on the size of the entropy encoded data. For instance, it may correspond to a packet of image or audio or video data or even to the entire length of a text file. In order to reduce the signaling overhead costs by including the markers, the markers may also be encoded, for instance, by an appropriate variable length code such as Huffman code or any integer code such as Elias code. Golomb code, exponential Golomb code, Unary code, etc. However, the markers may also be encoded by a fixed length code, and/or differentially.

Figure 3:
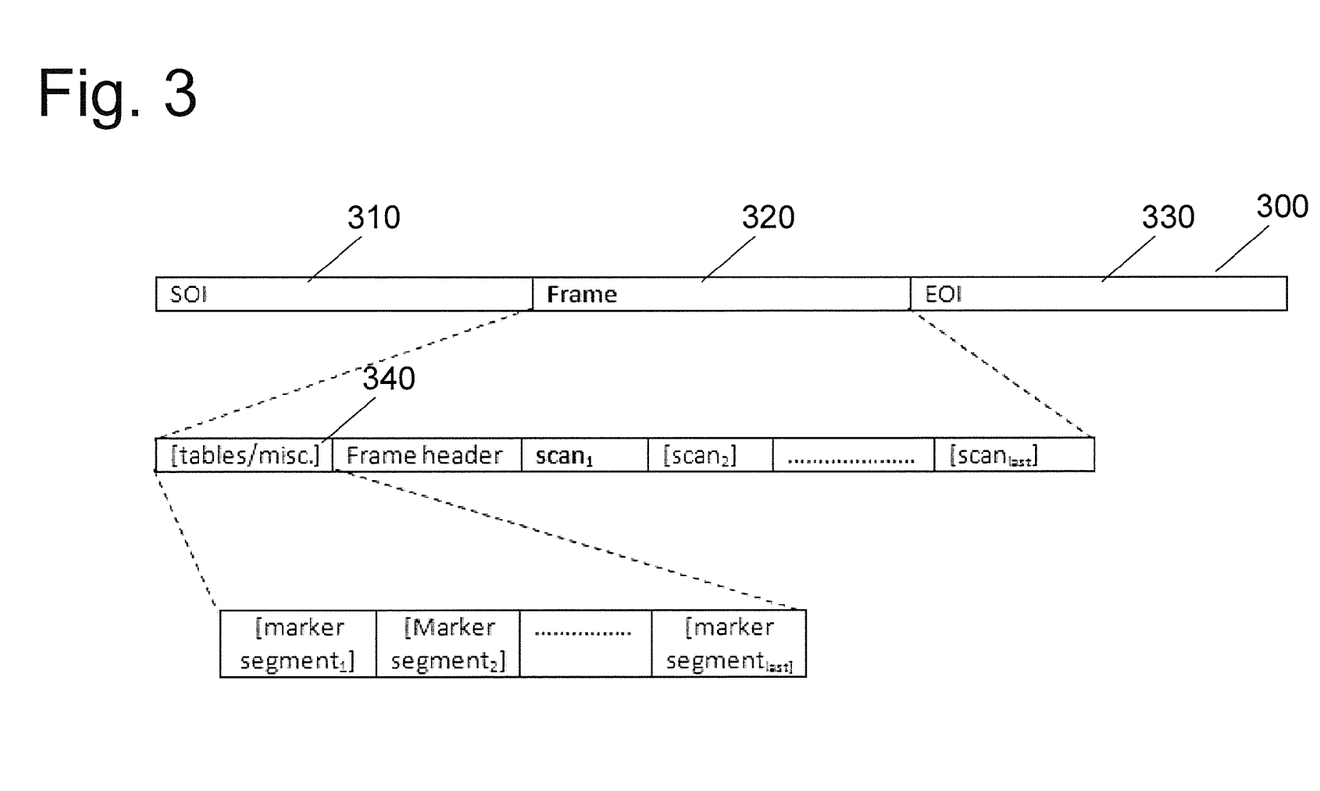
FIG. 3 is a schematic drawing illustrating a file format for a JPEG encoded images.

In accordance with an exemplary embodiment of the present invention, partition markers are used in order to facilitate parallel decoding of JPEG images. FIG. 3 illustrates an example of a possible JPEG file format 300 including a field for the start of image marker 310, the frame data 320, and a field for the end of image marker 330. The frame data may further include table specification and miscellaneous marker segment (denoted as "tables/misc.") 340 which may include entropy code tables, quantization tables and which also includes reserved fields and fields that can be used for application specifies information (such as variable $App_n$ marker). The frame data 320 may further include frame header, and the actual bitstream of compressed image data ("scan"). The partition markers as described above may be signaled within the table specification and miscellaneous marker segment 340. A number N of markers subdivide the encoded data into N+1 partitions which may be decoded in parallel.

Nevertheless, insertion of partition markers into JPEG files in order to enable parallel decoding is only an exemplary embodiment of the present invention, and the present invention is equally applicable to compression of text, such as file compression such as ZIP or GZIP. The present invention may also be applied to audio or video compression. Moreover, the partition markers to be signaled do not necessarily have to be embedded within a portion of files or packet headers. Alternatively, an extra packet or message of a predefined format may be used for their embedding. There is also a possibility that the partition markers will become standardized in a future text, audio, video or image compressions standard, or in any compression standard employing variable length coding.

The advantage of signaling the partition markers within the reserved portions of the data stream lies in the fact that it enables employing the present invention even into existing standards. For instance, a standard compliant JPEG encoder as illustrated above may easily be modified in order to support the present invention. The marker setting unit 230 within the JPEG encoder may keep count of the number of the entropy encoded symbols and/or length of the entropy coded data, and after encoding a complete image, it may find the appropriate partition markers in such a way that the number of bits used to encode symbols in each partition remains approximately equal. Then the approximate load for decoding each partition becomes equal. The marker may be a couple {byte offset, bit offset} as described above or any other information enabling determining the position of start of a new code-word corresponding to the first code-word of a new partition. The partition markers may then be encoded and are inserted, for instance as an $App_n$ marker into the table specification and miscellaneous marker segment 340 of the file header. For the particular example of JPEG encoding and decoding, it may be beneficial to also include into the header the DC values required for decoding next block's DC coefficients in order to further allow parallel decoding of the JPEG image data. In general, the information from a first partition required for the decoding of a second partition may be included together with the partition markers to the encoded data stream, for instance in header data.

Figure 4A:
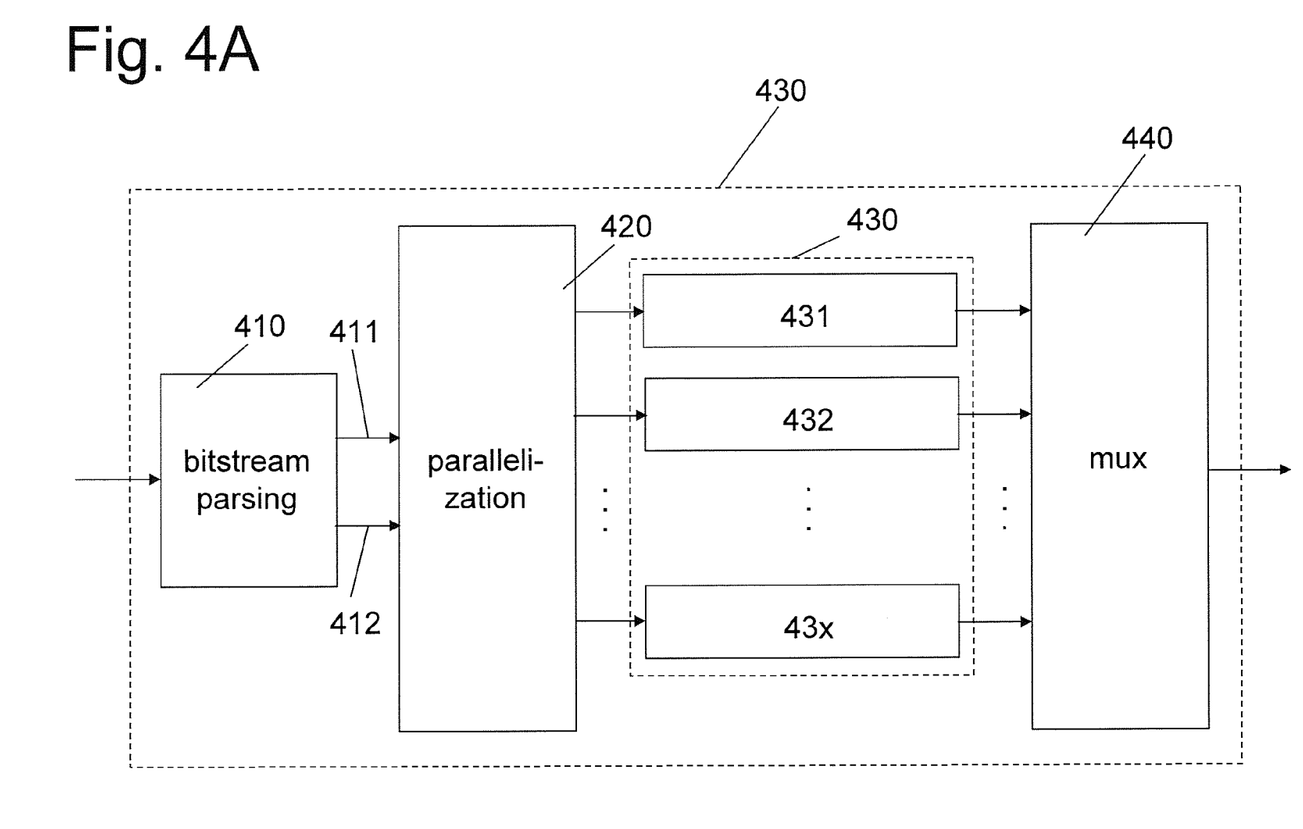
FIG. 4A is a block diagram illustrating an example of a decoder according to the present invention.

An example of a decoder in accordance with the present invention is illustrated in FIG. 4A. The entropy encoded data 121 enter the decoder 130. This input data 121 may, for instance, be retrieved from a storage or received from a channel. In particular, the storage may be any portable disk, such as a CD, DVD, Blu-ray, etc. Alternatively, the storage may be a hard drive optical or magnetic disc, flash, RAM or ROM or any other kind of memory. The channel may be any wired or wireless channel allowing the transmission of the data from the encoder to the decoder. The input data 121 are first parsed by the bitstream parser 410. This parsing includes extracting of partition marker(s) 411 and encoded data stream 412. The extracted partition markers 411 and the extracted bitstream data 412 are input to a parallelizer 420, which separates the encoded bitstream data 412 in accordance with the partition markers 411 into N parallel bitstreams of encoded data and delivers the N bitstreams to parallel entropy decoders 431, 432, . . . , 43N. After parallel entropy decoding 430, the partitions of decoded data may be multiplexed in order to form the desired output data 441. However, the partitions of entropy decoded data do not necessarily have to be multiplexed immediately. The partitions of entropy decoded data may further be decoded in parallel using other decoding methods, for instance image reconstruction such as JPEG decoding, or video decoding, or a run-length decoding, or any other decoding.

Advantageously, if N−1 partition markers are extracted, the corresponding N partitions of the encoded data are decoded in parallel by N entropy decoders 431, 432, and 43N. However, the present invention is not limited thereto. Even if N−1 partition markers are signalized, the decoder may still perform parallel decoding of less than N partitions. For instance, if seven markers are included for an entropy encoded data (bitstream), eight partitions of this entropy encoded data may be decoded in parallel by eight entropy decoders. However, such an entropy encoded data may also be decoded in four parallel decoders or two parallel decoders still keeping the load balanced. Of course, such a stream may also be decoded by three or five or any number of parallel decoders less than or equal to eight. However, the load balancing may become less efficient.

Similarly to the JPEG encoder, a JPEG decoder is also easily adaptable for employing the present invention. Such a modified JPEG decoder while parsing file header, retrieves byte/bit offset tuples from App$_n$ marker segment and possibly, also retrieves dependency payload from App$_n$ marker segment (information required for decoding of the partition) such as DC coefficients. Then, the incoming bitstream is divided in partitions according to the partition markers and each partition may be independently decoded in a parallel fashion. This allows maintaining the actual entropy coded bitstream unchanged, since the partition markers are added to a file header. The App$_n$ marker segment is an optional marker and thus, it is ignored by applications that do not understand it. Consequently, any existing decoder can keep on decoding the encoded data sequentially as it normally does.

Figure 4B:
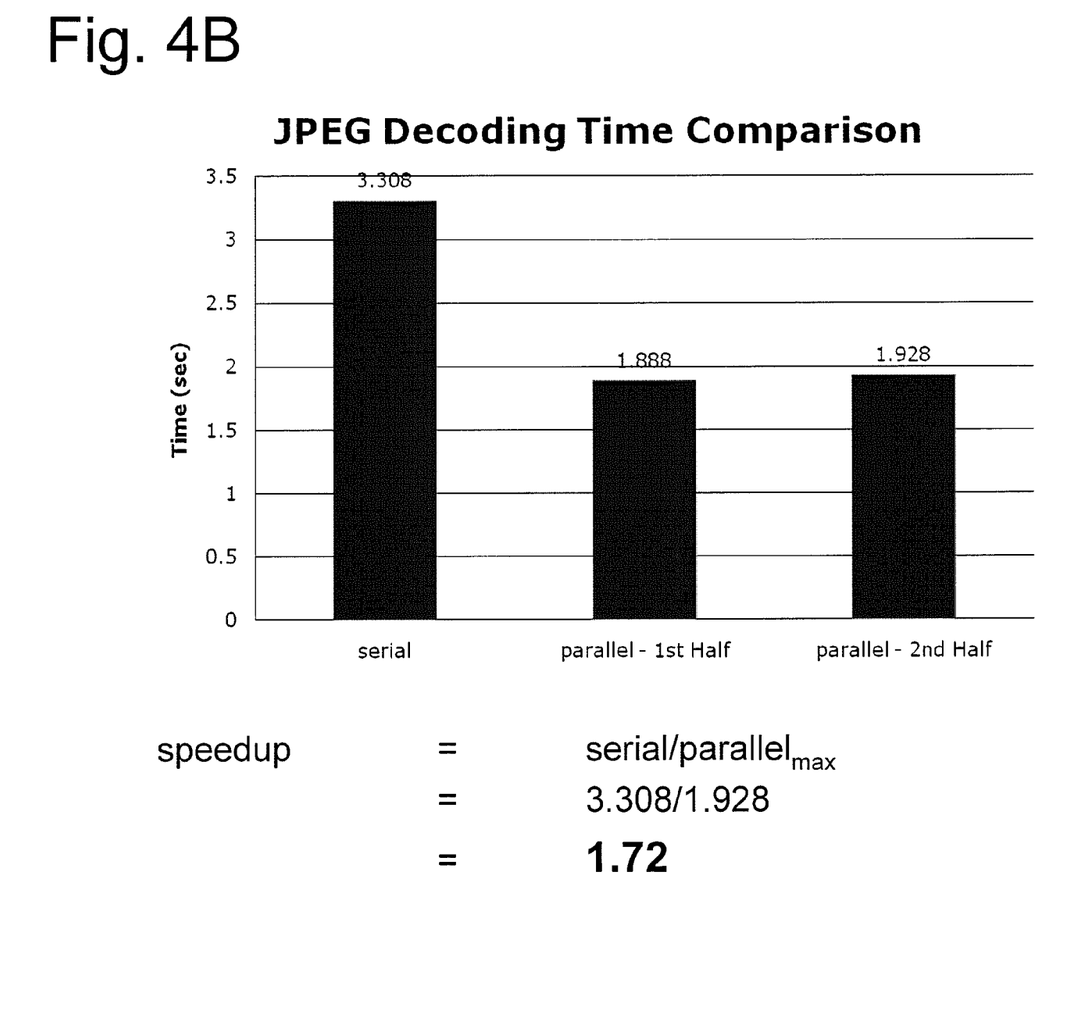
FIG. 4B is a graph illustrating decoding times obtained in an experiment of an exemplary decoding according to the present invention.

FIG. 4B illustrates results of an experiment concerning the parallel decoding of a JPEG data subdivided into two partitions (1$^{st}$ Half, 2$^{nd}$ Half) according to the above described exemplary embodiment of the present invention. As can be seen, a considerable speed-up may be achieved by such a parallel decoding.

An essential advantage of the decoding as described above lies in its conformance with a standard. Since partition markers may be inserted into an optional reserved part of the data stream, any decoder compliant with such a standard will be able to decode the encoded data such as JPEG data in the exemplary JPEG embodiment described above. In addition, a decoder embedded on a multi-core architecture will possibly be able to make use of the signalized partition markers and to subdivide entropy decoding of the input bitstream into a plurality of decoders and to perform the decoding in parallel.

The parallel decoder 430 may advantageously be implemented on a multi-core processor such as, for instance, dual-core or a quad-core processor, etc. However, the present invention is not limited thereto and the parallel decoding may be implemented on any parallel architecture, for instance, for multiple processors or multiple specialized hardware decoders, etc.

The present invention thus provides the possibility of parallelizing an inherently sequential process of variable length code decoding. This is facilitated by the adding a negligible side information to the encoded data stream. In order to achieve the parallelization, quite small modifications to existing software implementations are necessary. Basically, the decoding of the partitions separated by the position markers in accordance with the present invention may be performed in parallel by applying essentially the same decoding procedure as used for the non-separated data. The overhead introduced by the side information for signaling the markers is likely to be negligibly small, since in order to enable separation of the encoded stream into N+1 partitions, N partition markers need to be sent Thus, for parallel decoding using two parallel decoders, only a single partition marker is necessary.

In addition, the partition markers signalized for parallelization of decoding may also be used for recovery of the decoding process after an error has occurred in a portion of the encoded data. The decoder may jump to the next partition marker and resume decoding. This enhances the error resilience of the entropy encoded data stream.

In case the data to be encoded by the entropy code are inter-dependent, the information of a first partition necessary for decoding of a second partition may be included within the header information as well. This enables the parallelizing of the entire decoding process.

The present invention provides many benefits for a broad variety of industrial applications. For instance, digital cameras may profit from the parallelization by providing higher responsivity and faster user interface for thumbnails generation and image processing. Furthermore, video recording and/or playback using motion JPEG in a digital camera and gaming platforms may also profit from the faster and low-power decoding. Another advantageous application is closed circuit surveillance systems based on image and/or audio/video information. However, the present invention and its applicability is not limited to encoding/decoding of multimedia data. For instance, parallel decompressing of device firmware may provide faster boot-up times and faster firmware updates.

Another embodiment of the invention relates to the implementation of the above described various embodiments using hardware and software. It is recognized that the various embodiments of the invention may be implemented or performed using computing devices (processors). A computing device or processor may for example be general-purpose processors, digital signal processors (DSP), application specific integrated circuits (ASIC), field programmable gate arrays (FPGA) or other programmable logic devices, etc. The various embodiments of the invention may also be performed or embodied by a combination of these devices.

Further, the various embodiments of the invention may also be implemented by means of software modules, which are executed by a processor or directly in hardware. Also a combination of software modules and a hardware implementation may be possible. The software modules may be stored on any kind of computer readable storage media, for example RAM, EPROM, EEPROM, flash memory, registers, hard disks, CD-ROM, DVD, etc.

Summarizing, the present invention provides a mechanism for parallelization of decoding of a data stream encoded with a variable length code. Input data are encoded with a variable length code. One or a plurality of markers is/are determined, each of which indicates a position within the encoded data, and the determined markers are included into the encoded data stream together with the encoded data. At the decoder side, the markers are parsed from the encoded data stream and based on the extracted markers, the encoded data is separated into a plurality of partitions, which are decoded separately and in parallel.

We claim:

1. A method for encoding input data into a data stream, the method comprising:
    encoding with a variable-length-code encoder, the input data using a variable length code;
    determining with a marker setting unit, marker data indicating a position within the input data encoded with the variable length code;
    including with a data stream generator, into the data stream the encoded input data and the determined marker data; and
    marking boundaries between partitions of entropy coded data by adding partition markers to the encoded data stream so that they are decoded independently, and so that their decoding results in an approximately equal number of computations on parallel decoders that enables load balancing in a parallel processing environment.

2. The method according to claim 1, wherein the determining marker data determines N positions, N being an integer number equal to or greater than 1, within the input data encoded with the variable length code in such a way that the N positions separate the encoded input data into N+1 of partitions of essentially the same length.

3. The method according to claim 1 wherein the marker data indicates a position within the encoded input data, on which a new code-word of the variable length code starts.

4. The method according to claim 1 wherein the marker data include at least one of a byte offset within the data encoded with a variable length code and a bit offset within a byte.

5. The method according to claim 4, wherein the byte offset specifies a number of bytes either from the beginning of the data encoded with a variable length code, or from the middle of the data encoded with a variable length code, or from the position within the data encoded with a variable length code indicated by a previous byte offset and bit offset.

6. The method according to claim 1 wherein the including comprises embedding of the marker data in a field reserved for future use or in an optional field within a header of a file with a standardized format, the file including the data encoded with a variable length code.

7. The method according to claim 1, wherein the input data are encoded with JPEG and the marker data is embedded within the table specification and miscellaneous marker segment of a JFIF file format.

8. A computer program product comprising a non-transitory computer readable medium having a computer readable program code embodied thereon, the program code operative to carry out the method according to claim 1.

9. An encoder for encoding input data into a data stream, the encoder comprising:
 a variable length coder for encoding the input data using a variable length code;
 a marker setting unit for determining marker data indicating a position within the input data encoded with the variable length code; and
 a data steam generator for including into the data stream the encoded input data and the determined marker data,
 wherein the encoder is configured for marking boundaries between partitions of entropy coded data by adding partition markers to the encoded data stream so that they are decoded independently, and so that their decoding results in an approximately equal number of computations on parallel decoders that enables load balancing in a parallel processing environment.

10. The encoder according to claim 9, wherein the mark setting unit is capable of determining marker data by determining N positions, N being an integer number equal to or greater than 1, within the input data encoded with the variable length code in such a way that the N positions separate the encoded input data into N+1 of partitions of essentially the same length.

11. The encoder according to claim 9 wherein the marker data indicates a position within the encoded input data, on which a new code-word of the variable length code starts.

12. The encoder according to claim 9 wherein the marker data include at least one of a byte offset within the data encoded with a variable length code and a bit offset within a byte.

13. The encoder according to claim 12, wherein the byte offset specifies a number of bytes either from the beginning of the data encoded with a variable length code, or from the middle of the data encoded with a variable length code, or from the position within the data encoded with a variable length code indicated by a previous byte offset and bit offset.

14. The encoder according to claim 9 wherein the data stream generator is configured to embed the marker data in a field reserved for future use or in an optional field within a header of a file with a standardized format, the file including the data encoded with a variable length code.

15. The encoder according to claim 9, wherein the input data are encoded with JPEG and the marker data is embedded within the table specification and miscellaneous marker segment of a JFIF file format.

\* \* \* \* \*